(12) United States Patent
Su

(10) Patent No.: US 10,978,142 B2
(45) Date of Patent: *Apr. 13, 2021

(54) FULL-SWING DUAL-RAIL SRAM SENSE AMPLIFIER

(71) Applicant: Oracle International Corporation, Redwood Shores, CA (US)

(72) Inventor: Jason Su, Cupertino, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/512,133

(22) Filed: Jul. 15, 2019

(65) Prior Publication Data

US 2019/0341101 A1  Nov. 7, 2019

Related U.S. Application Data

(63) Continuation of application No. 15/839,375, filed on Dec. 12, 2017, now Pat. No. 10,354,720.

(51) Int. Cl.
| | | |
|---|---|---|
| *G11C 11/419* | (2006.01) | |
| *G11C 5/06* | (2006.01) | |
| *G11C 7/06* | (2006.01) | |
| *G11C 7/12* | (2006.01) | |
| *G11C 7/04* | (2006.01) | |
| *G11C 8/08* | (2006.01) | |

(Continued)

(52) U.S. Cl.
CPC ............ *G11C 11/419* (2013.01); *G11C 5/063* (2013.01); *G11C 7/04* (2013.01); *G11C 7/065* (2013.01); *G11C 7/12* (2013.01); *G11C 8/08* (2013.01); *G11C 16/24* (2013.01); *G11C 16/28* (2013.01)

(58) Field of Classification Search
CPC .......... G11C 11/419; G11C 8/08; G11C 7/04; G11C 7/065; G11C 5/063; G11C 7/12; G11C 11/4091
See application file for complete search history.

(56) References Cited

U.S. PATENT DOCUMENTS

| | | |
|---|---|---|
| 8,102,728 B2 | 1/2012 | Campbell et al. |
| 8,279,687 B2 | 10/2012 | Adams et al. |
| 8,462,572 B2 | 6/2013 | Sharma et al. |

(Continued)

OTHER PUBLICATIONS

Pandey, et al; Design and Analysis of Low Power Latch Sense Amplifier, ISR Journal of Electronics and Communication Engineering; vol. 9, Issue 6, Ver. IV (Nov.-Dec. 204), pp. 69-73; www.iosrjournals.org.

*Primary Examiner* — David Lam
(74) *Attorney, Agent, or Firm* — Kowert, Hood, Munyon, Rankin & Goetzel, P.C.

(57) ABSTRACT

A method and apparatus for reading data from a memory is disclosed. A particular data storage cell may generate a voltage difference between a true bit line and a complement bit line coupled to the data storage cell. A selection circuit may generate a voltage level on a true data line and a complement data line using the voltage levels of the true and complement bit lines. An amplifier circuit may amplify a voltage difference between the true data line and the complement data line to generate a full-swing voltage difference between the true and complement data lines, and may preset the voltage levels of the true and complement data lines to a ground potential based on a reset timing signal.

14 Claims, 11 Drawing Sheets

(51) Int. Cl.
*G11C 16/24* (2006.01)
*G11C 16/28* (2006.01)

(56) References Cited

U.S. PATENT DOCUMENTS

| | | |
|---|---|---|
| 8,536,898 B2 | 9/2013 | Rennie et al. |
| 9,087,607 B2* | 7/2015 | Adams .................... G06F 30/39 |
| 9,251,889 B2 | 2/2016 | Goel et al. |
| 9,275,721 B2 | 3/2016 | Chen et al. |
| 9,384,825 B2 | 7/2016 | Lin et al. |
| 9,455,023 B1 | 9/2016 | Xu |
| 10,354,720 B2* | 7/2019 | Su ......................... G11C 11/419 |
| 2006/0171188 A1* | 8/2006 | Kawasumi ............. G11C 11/419 |
| | | 365/154 |
| 2010/0238745 A1* | 9/2010 | Campbell ...... H03K 19/018528 |
| | | 365/189.11 |
| 2012/0113734 A1* | 5/2012 | Yamada ............... G11C 29/025 |
| | | 365/201 |
| 2013/0135946 A1 | 5/2013 | Katoch |
| 2014/0140575 A1 | 5/2014 | Wolf |
| 2015/0269990 A1 | 9/2015 | Sahu et al. |

* cited by examiner

FULL-SWING DUAL-RAIL SRAM SENSE AMPLIFIER

The present application is a continuation of U.S. application Ser. No. 15/839,375, filed Dec. 12, 2017 (now U.S. Pat. No. 10,354,720); the disclosure of which is incorporated by reference in the present application in its entirety.

BACKGROUND

Technical Field

Embodiments described herein are related to the field of memory design, and more particularly to amplifying signals generated by a selected data storage cell.

Description of the Related Art

Computing systems typically include a variety of components. Such components may include processor circuits, memory circuit, input/output (I/O) circuits, analog or mixed signal circuits, and the like. Such circuits may be fabricated on a common integrated circuit, separate integrated circuits, or any suitable combination thereof.

During operation of the computing system, a processor circuit may retrieve software or program instructions from one or more memory circuits included in the computing system, and then execute the retrieve instructions. In response to executing the software or program instructions, the processor circuit may retrieve data from the one or more memory circuits, generate new data using the retrieved data, and then store the newly generated data into the memory circuits.

Such memory circuits typically include a number of data storage cells composed of interconnected transistors fabricated on a semiconductor substrate. Such data storage cells may be constructed according to a number of different circuit design styles. For example, the data storage cells may be implemented as a single transistor coupled to a capacitor to form a dynamic storage cell. Alternatively, cross-coupled inverters may be employed to form a static storage cell, or a floating gate MOSFET may be used to create a non-volatile storage cell.

SUMMARY OF THE EMBODIMENTS

System and methods disclosed herein provide techniques for reading data stored in a memory. Broadly speaking, a particular data storage cell of a plurality of data storage cells included in a particular column of a plurality of columns may generate a voltage difference between a true bit line and complement bit line. A selection circuit, based on a plurality of selection signals, may be configured to generate a voltage level on a true data line and a voltage level on a complement data line using the voltage level of the true bit line and the voltage level of the complement bit line. An amplifier circuit may be configured to amplify a voltage difference between the voltage levels of the true data line and the complement data line to generate a full-swing voltage difference between the voltage levels of the true data line and the complement data line, and preset the voltage level of the true data line and the voltage level of the complement data line to a ground potential based on a reset timing signal.

In one embodiment, the particular column may include a driver circuit configured to generate a voltage level on a true column line based upon the voltage level of the complement bit line and generate a voltage level on a complement column line based upon the voltage level of the true bit line.

In another specific embodiment, the particular column may include a preset circuit configured to preset, based on a preset signal, the voltage level of the true column line and the voltage level of the complement column line to particular voltage level.

BRIEF DESCRIPTION OF THE DRAWINGS

The following detailed description makes reference to the accompanying drawings, which are now briefly described.

Figure 1:
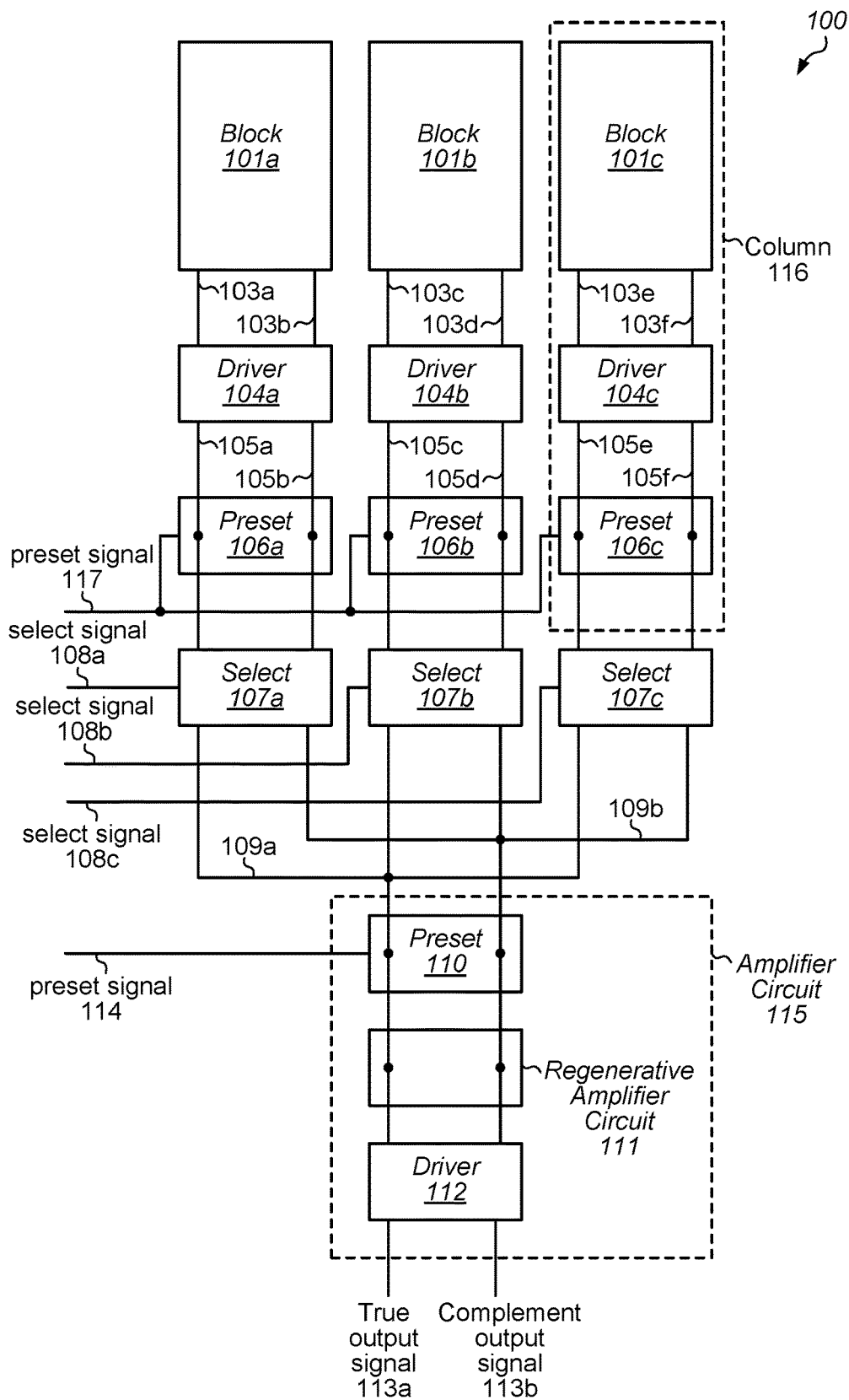
FIG. 1 is a block diagram that illustrates an embodiment of a memory circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

A computing system may include one or more integrated circuits, such as, e.g., a central processing unit (CPU) and memory circuits. Such memory circuits may be fabricated on an integrated circuit including the CPU or on other integrated circuits. The memory circuits may be used for the storage or software or program instructions, as well as data or operands that may be used by the CPU during execution of the software an program instructions.

During operation, a CPU, or other processor or controller circuit, may retrieve data from or store data in a memory circuit. When data is retrieved from a memory, one or more data storage cells (also referred to herein as "memory cells") may generate a signal indicative of stored data. Before the data may be consumed by other circuits, such as, e.g., a processor circuit, it must be amplified. Current amplification methods may rely on amplifier circuits, which are susceptible to variations resulting from fabrication, operating temperature, and power supply voltage level. To account for such variations, extra margin may be added when designing amplifier circuits resulting in increases in circuit area and reductions in performance. The embodiments illustrated in the drawings and described herein may provide techniques amplifying the signal generated by a data storage cell while limiting impacts on circuit area and performance.

Turning to FIG. 1, an embodiment of a memory circuit is depicted. In the illustrated embodiment, memory circuit 100 includes blocks 101a-c, driver circuits 104a-c, preset circuits 106a-c, select circuits 107a-c, and amplifier circuit 115.

Each of blocks 101a-c may include multiple data storage cells. In various embodiments, the data storage cells may be static, dynamic, non-volatile, or any other suitable type of data storage cell. As described below in more detail in regard to FIG. 2, a particular one of blocks 101a-c, the include data storage cells are coupled to true and complement bit line. For example, the data storage cells included in block 101a are coupled to true bit line 103a and complement bit line 103b, the data storage cells in block 101b are coupled to true bit line 103c and complement bit line 103d, and the data storage cells in block 101c are coupled to true bit line 103e and complement bit line 103f. Although only three blocks are depicted in FIG. 1, in other embodiments, any suitable number of blocks may be employed.

In response to receiving a read command, memory circuit 100 may decode an address included with the read command to generate multiple selection signals, such as select signal 108a, for example. Using the multiple selection signals, a particular data storage cells in each of blocks 101a-c may be selected. The selected data storage cells may then generate a voltage difference between the true and complement data lines coupled to the selected data storage cells. In various embodiments, the voltage difference generated may differentially encode data storage in the selected data storage cells.

Driver circuits 104a-c are coupled to respective pairs of bit lines and column lines. For example, driver circuit 104a is coupled to true bit line 103a, complement bit line 103b, true column line 105a, and complement column line 105b. During operation, a particular driver circuit of driver circuits 104a-c may generate a voltage on its associated true and complement column lines based on voltage levels of the true and complement bit lines coupled to the driver circuit. For example, driver circuit 104a may generate a voltage level on complement column line 105b based on the voltage level of true bit line 103a, and may generate a voltage level on true column line 105a based on the voltage level of complement column line 105b.

Each of preset circuit 106a-c s coupled to respective pairs of column lines, and is controlled by preset signal 117. For example, preset circuit 106a is coupled to true column line 105a and complement column line 105b. In various embodiments, preset signal 117 may be generated by a timing and control circuit (not shown) that is included in memory circuit 100. In response to an assertion of preset signal 117, preset circuit 106a-c may preset their associated column lines to a particular voltage level. For example, preset circuit 106a may set the voltage levels of both true column line 105a and complement column line 105b to the particular voltage. It is noted that the particular voltage level may, in various embodiments, be a voltage level at or near a voltage level of a power supply signal for memory circuit 100, or any other suitable voltage level.

In some cases, a block, driver circuit, and preset circuit are grouped together as a column, such as column 116, for example. In the present embodiment, column 116 includes block 101c, true bit line 103e, complement bit line 103f, driver circuit 104c, true column line 105e, complement column line 105f, and preset circuit 106c. In other embodiments, different circuit may be included or excluded from a particular column.

Select circuits 107a-c are each coupled to true data line 109a and complement data line 109b, as well as respective pairs of column lines and respective select signals. For example, select circuit 107a is coupled to true column line 105a, complement column line 105b, and select signal 108a. During operation, one of select signals 108a-c may be activated based on address information received as part of a read command, and in response to the activation of one of select signals 108a-c, a corresponding one of select circuit 107a-c may generate a voltage on true data line 109a and complement data line 109b based on the voltage levels of the select circuits associated pair of column lines.

For example, in the case where select signal 108a is asserted, select circuit 107a will generate voltages on true data line 109a and complement data line 109b based on the voltage levels of true column line 105a and complement column line 105b. As described below in more detail, to generate the aforementioned voltages on true data line 109a and complement data line 109b, select circuits 107a-c may couple a particular pair of column lines to true data line 109a and complement data line 109b.

Amplifier circuit 115 is coupled to true data line 109a and complement data line 109b, as well as, true output signal 113a and complement output signal 113b. During operation, amplifier circuit 115 may amplify a voltage difference between a voltage level of true data line 109a and complement data line 109b to generate a full-swing voltage difference between the voltage levels of true data line 109a and complement data line 109b. As used and described herein, a full-swing voltage difference is a voltage difference between two signals whose voltage levels may transition between ground potential and a voltage level at or near a voltage level of a power supply signal. For example, during operation, amplifier circuit 115 may modify the voltage level of one either true data line 109a or complement data line 109b to be at or near ground potential, and modify the level of the other data line to a voltage level at or near the voltage level of a power supply signal coupled to memory circuit 100. The difference in voltage between true data line 109a and complement data line 109b may be substantially the same as the voltage level of the power supply signal. By employing both true and complement data lines, i.e., dual-rails, with full-swing signals, amplifier circuit 115 may limit variations resulting from fabrication, operating temperature, and power supply voltage level, while minimizing the impact on circuit design area.

Amplifier circuit 115 includes preset circuit 110, regenerative amplifier circuit 111, and driver circuit 112. As described below in more detail, preset circuit 110 may be configured to preset the voltage levels of true data line 109a and complement data line 109b to ground potential, while regenerative amplifier circuit 111 may employed cross-coupled devices to amplify the voltage difference between the two data lines. Driver circuit 112 may be configured to generate true output signal 113a and complement output signal 113b by inverting the logical sense of true data line 109a and complement data line 109b.

The embodiment of a memory circuit illustrated in FIG. 1 is merely an example. In other embodiments, different circuit blocks, and different arrangements of circuit blocks may be employed.

Figure 2:
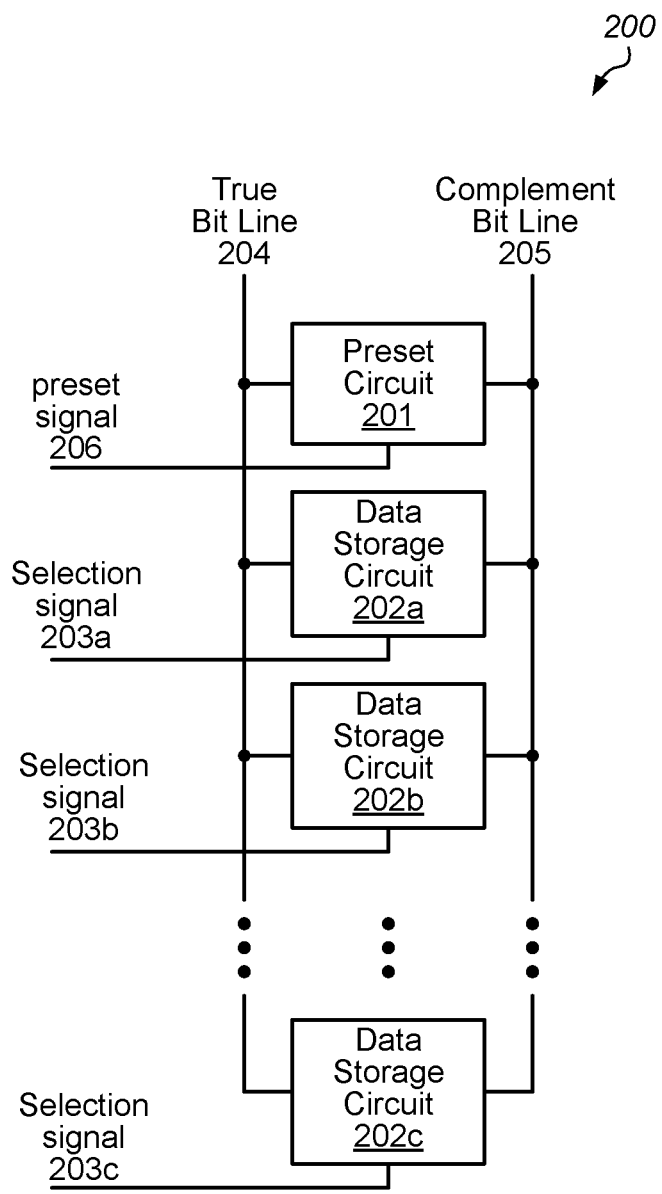
FIG. 2 is a block diagram that illustrates another embodiment of a memory block.

As mentioned above, a memory block (or simply "block") may include multiple data storage cells. An embodiment of a memory block is illustrated in FIG. 2. In various embodiments, memory block 200 may correspond to any of blocks 101a-c as illustrated in FIG. 1. In the illustrated embodiment, memory block 200 includes preset circuit 201, and data storage cell 202a through data storage circuit 202c.

Preset circuit 201 and data storage circuits 202a-c are coupled to true bit line 204 and complement bit line 205. In various embodiments, true bit line 204 and complement bit line 205 may correspond to any of bit line pairs 103a-b, 103c-d, and 103e-f. Each of data storage circuit 202a-c is coupled to a respective one of selection signals 203a-c, and preset circuit 201 may be coupled preset signal 206. In various embodiments, preset signal 206 may correspond to preset signal 115 as illustrated in FIG. 1, and selections signals 203a-c may correspond to selections signals 116 as depicted in FIG. 1.

As described below in more detail, preset circuit 201 may set the voltage levels of true bit line 204 and complement bit line 205 to a particular voltage level in response to the assertion of preset signal 206. In various embodiments, the particular voltage level may be a voltage level at or near a voltage level of a power supply for the memory circuit. The voltage levels of true bit line 204 and complement bit line 205 may be preset prior to the start of an access to the memory circuit. Such an access may include both read and write accesses to the memory circuit.

In various embodiments, data storage circuits 202a-c may correspond to a particular type of data storage circuit, such as, dynamic, static, non-volatile, or any other suitable circuit for storing data. During operation, a particular one of data storage circuits 202a-c may generate a difference in the voltage levels of true bit line 204 and complement bit line 205 in response to a corresponding one of selection signals 203a-c being asserted. In some embodiments, a data storage circuit, such as data storage circuit 203a, in response to assertion of a selection signal, may sink or source a current from either true bit line 204 or complement bit line 205 based on a value of data stored in the data storage circuit to generate the different in the voltage levels between true bit line 204 and complement bit line 205.

Such a difference in the voltage levels of true bit line 204 and complement bit line 205 may encode a particular logical data value. Encoding a logical data value as the difference between two voltage levels is commonly referred to "differential encoding."

It is noted that the embodiment illustrated in FIG. 2 is merely an example. In other embodiments, different numbers of data storage circuits and preset circuits may be used.

Figure 3:
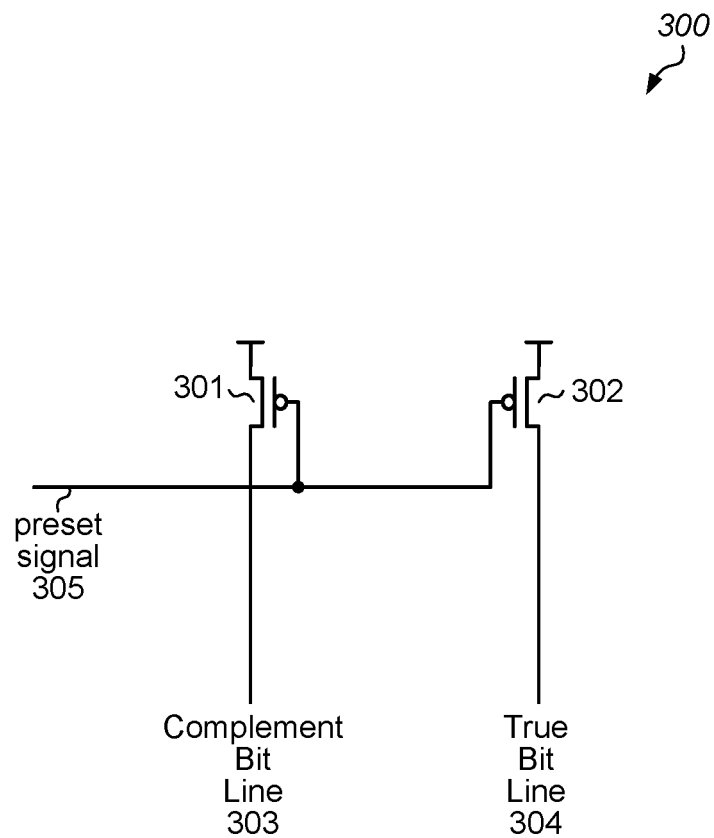
FIG. 3 illustrates an embodiment of a preset circuit.

As mentioned above, in some embodiments, bit lines included within a block in a memory may be preset to a particular voltage level prior to performing a read operation. An embodiment of a preset circuit is illustrated in FIG. 3. In various embodiments, preset circuit 300 may correspond to preset circuit 201 as illustrated in FIG. 2. In the illustrated embodiment, preset circuit 300 includes devices 301 and 302.

Device 301 is coupled between a positive power signal (commonly referred to as "VDD") and complement bit line 303. Device 302 is coupled between the positive power signal and true bit line 304. In various embodiments, complement bit line 303 may correspond to complement bit line 205, and true bit line 304 may correspond to true bit line 204. Each of devices 301 and 302 are controlled by preset signal 305. In various embodiments, preset signal 305 may correspond to preset signal 206.

As used and described herein a device refers to transconductance device where the current flowing through the device is based upon a voltage across the device. For example, in various embodiments, a device may be a p-channel or n-channel metal-oxide semiconductor field-effect transistor, a PNP or NPN bipolar transistor, or any other suitable transconductance device.

During operation, when preset signal 305 is set to a low logic level, devices 301 and 302 become active, sourcing current to complement bit line 303 and true bit line 304, respectively. As current is sourced to complement bit line 303 and true bit line 304, voltage levels on complement bit line 303 and true bit line 304 increase to a level at or near a voltage level of the power supply signal. When preset signal 305 is set to a high logic level, devices 301 and 302 become inactive, resulting in a high impedance between complement bit line 303 and the power supply signal, and between true bit line 304 and the power supply signal.

As used and described herein, a logical-0, logic 0 value or low logic level, describes a voltage sufficient to activate a p-channel metal-oxide semiconductor field effect transistor (MOSFET), and that a logical-1, logic 1 value, or high logic level describes a voltage level sufficient to activate an n-channel MOSFET. It is noted that, in various other embodiments, any suitable voltage levels for logical-0 and logical-1 may be employed.

It is noted that the embodiment depicted in FIG. 3 is merely an example. In other embodiments, different devices, and different arrangements of devices may be employed.

Figure 4:
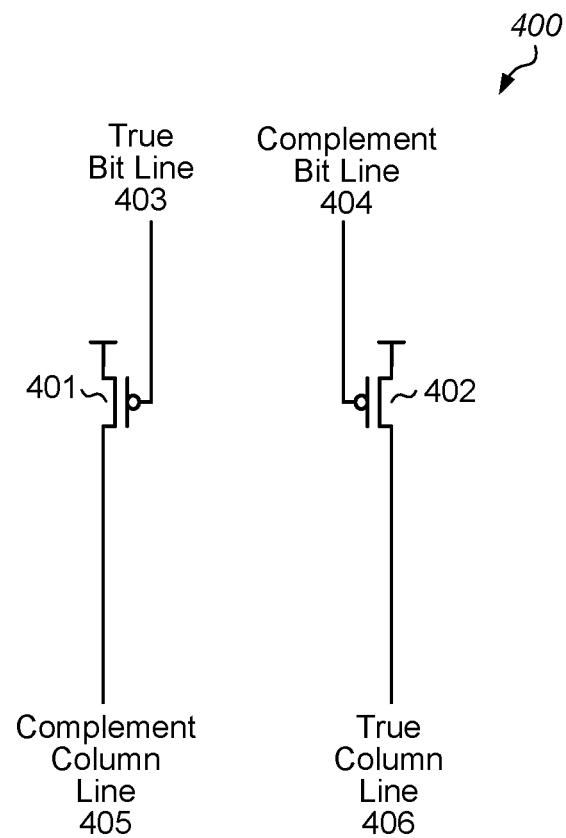
FIG. 4 illustrates an embodiment of a driver circuit.

Once bit lines in a particular block have been preset to a desired voltage level, a read operation may be performed. As described above, as part of a read operation, a selected data storage cell may generate a voltage difference between a true bit line and a complement bit line, which corresponds to the data stored in the selected data storage cell. The voltage levels of the true bit line and complement bit line may be transferred to true and complement column lines using a driver circuit. An embodiment of a driver circuit is illustrated in FIG. 4.

In various embodiments, driver circuit 400 may correspond to any of driver circuits 104a-c as illustrated in the embodiment of FIG. 1. In the illustrated embodiment, driver circuit 400 includes devices 401 and 402. Device 401 is coupled between the power supply signal and complement column line 405, and is controlled by true bit line 403 Device 402 is coupled between the power supply signal and true column line 406, and is controlled by complement bit line 404. In some embodiments, true bit line 403 may correspond to true bit line 204, and complement bit line 404 may correspond to complement bit line 205.

During operation, a voltage level of true bit line 403 determines current sourced to complement column line 405 by device 401, and a voltage level of complement bit line 404 determines current sourced to true column line 406 by device 402. It is noted that the current sourced by devices 401 and 402 may also be dependent on physical sizes of the devices, temperature of the devices, the voltage level of the power supply signal, and the like.

As a result of the voltage difference between true bit line 403 and complement bit line 404 generated by a selected data storage cell, one of true bit line 403 or complement bit line 404 will have a lower voltage level than the other. As described below in more detail, voltage levels of complement column line 405 and true column line 406 may be preset to a voltage level at or near the voltage level of the power supply signal. The lower voltage level on one of the bit lines will result in a corresponding one of devices 401 or 402, to conduct more current, thereby propagating the voltage difference between true bit line 403 and complement bit line 404, which encodes the data stored in the selected data storage cell, to complement column line 405 and true column line 406.

When the read operation is complement, true bit line 403 and complement bit line 404 may be preset to a voltage level at or near the voltage level of the power supply. The voltage level at or near the voltage level of the power supply on true bit line 403 and complement bit line 404 disables devices 401 and 402, allowing other circuits to preset the voltage levels of complement column line 405 and true column line 406.

It is noted that the embodiment depicted in FIG. 4 is merely an example. In other embodiments, different numbers and arrangements of devices are possible and contemplated.

Figure 5:
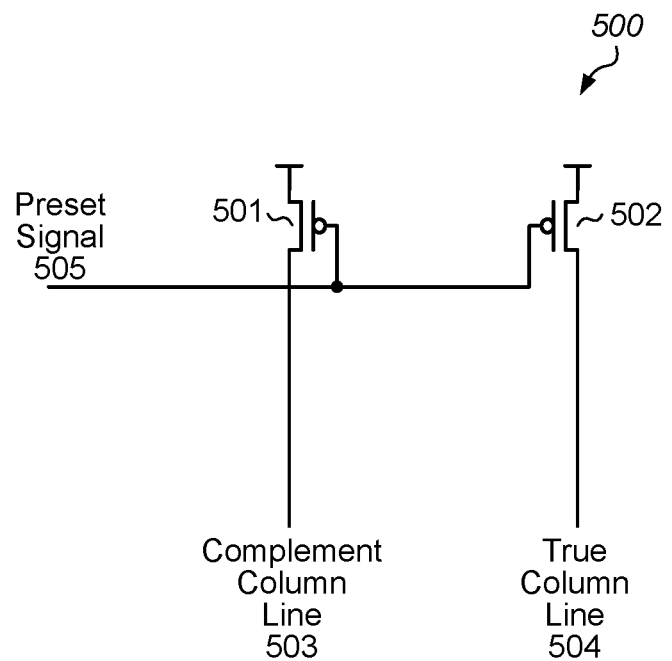
FIG. 5 illustrates a different embodiment of a preset circuit.

Another embodiment of a preset circuit is illustrated in FIG. 5. In various embodiments, preset circuit 500 may correspond to any of preset circuits 106a-c as depicted in FIG. 1. In the illustrated embodiment, the preset circuit 500 includes devices 501 and 502.

Device 501 is coupled between complement column line 503 and a power supply signal, and device 502 is coupled between true column line 504 and the power supply signal. In various embodiments, complement column line 503 may correspond to any of complement column lines 105b, 105d, and 105f and true column line 504 may correspond to any of true column lines 105a, 105c, and 105e. Devices 501 and 502 are both controlled by preset signal 505, which may, in some embodiments, correspond to preset signal 106 as depicted in FIG. 1.

During operation, in response to a low logic level on preset signal 505, devices 501 and 502 activate, allowing current to be sourced from the power supply signal to complement column line 503 and true column line 504. In response to the current being source, voltage levels of complement column line 503 and true column line 504 may each increase to a voltage levels at or near a voltage level of the power supply signal. In some embodiments, the voltage level at or near the voltage level of the power supply signal may correspond to a preset voltage level.

When preset signal 505 transitions to a high logic level, devices 501 and 502 may deactivate. Once the devices deactivate, complement column line 503 and true column line 504 are isolated from the power supply signal, and no further current can be sourced to complement column line 503 and true column line 504 from the power supply signal.

It is noted that the embodiment depicted in FIG. 5 is merely an example. In other embodiments, different types and numbers of devices may be employed.

Figure 6:
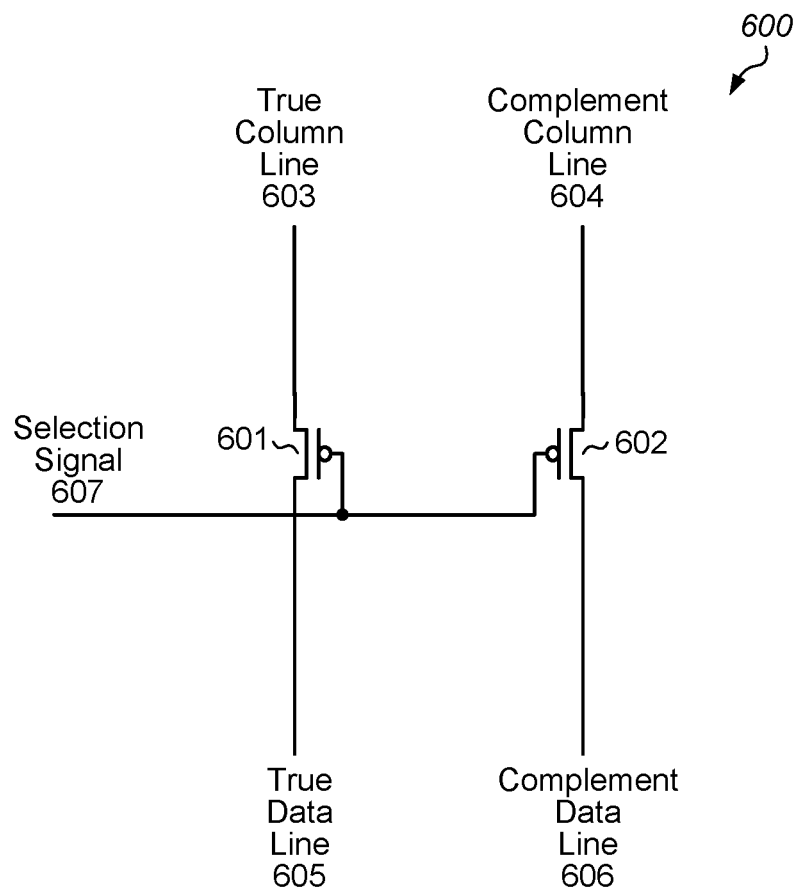
FIG. 6 illustrates an embodiment of a select circuit.

In many memory circuits, such as, e.g., memory circuit 100, multiple banks may be activated in response to read operation. Data retrieved from a data storage cell in each activated bank may be propagates to respective pairs of column lines. Selection signals may be used in conjunction with select circuits to select a particular pair of column lines, and propagate the voltage levels present on the selected column line to data lines for final amplification. An embodiment of a select circuit is illustrated in FIG. 6. In various embodiments, selection circuit 600 may correspond to any of select circuit 107a-c as illustrated in FIG. 1.

In the illustrated embodiment, selection circuit 600 includes devices 601 and 602 Device 601 is coupled between true column line 603 and true data line 605, and device 602 is coupled between complement column line 604 and complement data line 606. In some embodiments, true column line 603 may correspond to any of true column lines 105a, 105c, or 105e, and complement column line 604 may correspond to any of complement column lines 105b, 105d, or 105f. Additionally, true data line 605 may correspond to true data line 109a, and complement data line 606 may correspond to complement data line 109b. Devices 601 and 602 are both controlled by selection signal 607, which may, in various embodiments, correspond to any of select signals 108a-c.

During operation, in response to a low logic level on selection signal 607, devices 601 and 602 may activate. Once activated, devices 601 and 602 provided low impedance paths between true column line 603 and true data line 605, and between complement column line 604 and complement data line 606. The low impedance paths coupled the column lines to the data lines, thereby allowing voltage levels of true column line 603 and complement column line 604 to propagate to true data line 605 and complement data line 606, respectively.

When selection signal 607 transitions to a high logic level, devices 601 and 602 deactivate. Once the devices 601 and 602 deactivate, true column line 603 and complement column line 604 are decoupled from true data line 605 and complement data line 606, respectively, thereby isolating the signals.

Although depicted as p-channel MOSFETs in the illustrated embodiment, devices 601 and 602 may, in some embodiments, include n-channel MOSFETs in parallel with the p-channel MOSFETs.

Figure 7:
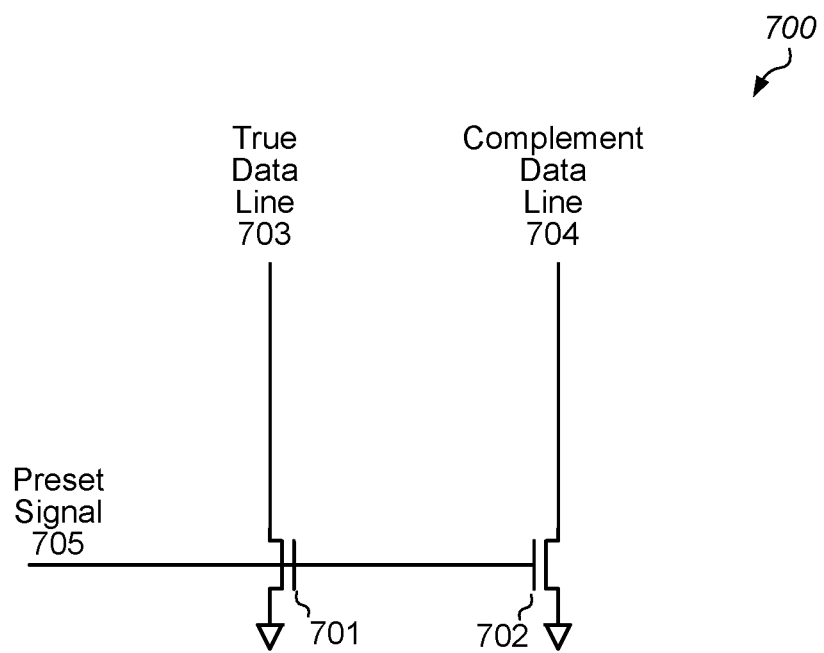
FIG. 7 illustrates another embodiment of a preset circuit.

As described above, various signal lines within a memory circuit may be preset to a particular voltage level before a read operation may be completed. An embodiment of a preset circuit for presetting voltage levels of data lines is illustrated in FIG. 7. In various embodiments, preset circuit 700 may correspond to preset circuit 110 as illustrated in the embodiment of FIG. 1. In the illustrated embodiment, preset circuit 700 includes devices 701 and 702.

Device 701 is coupled between true data line 703 and a ground supply signal, and device 702 is coupled between complement data line 704 and the ground supply signal. In various embodiments, true data line 703 and complement data line 704 may correspond to correspond to true data line 109a and complement data line 109b, respectively. Each of devices 701 and 702 are controlled by preset signal 705, which may correspond to preset signal 114 as depicted in FIG. 1. Although only two devices are depicted in the embodiment of FIG. 7, in other embodiments, any suitable number of devices may be employed.

During operation, devices 701 and 702 are activated by a high logic level on preset signal 705, thereby providing a low impedance path between true data line 703 and complement data line 704 to the ground supply signal. Current will be sunk from true data line 703 and complement data line 704 via devices 701 and 702, respectively, thereby reducing the voltage levels of true data line 703 and complement data line 704 until the voltage levels are at or near ground potential. In various embodiments, a voltage level at or near ground potential may be the desired preset voltage level. In other embodiments, any suitable voltage level may be used as the desired preset voltage level.

It is noted that the embodiment illustrated in FIG. 7 is merely an example. In other embodiments, different numbers of devices, and different arrangements of devices may be employed.

Figure 8:
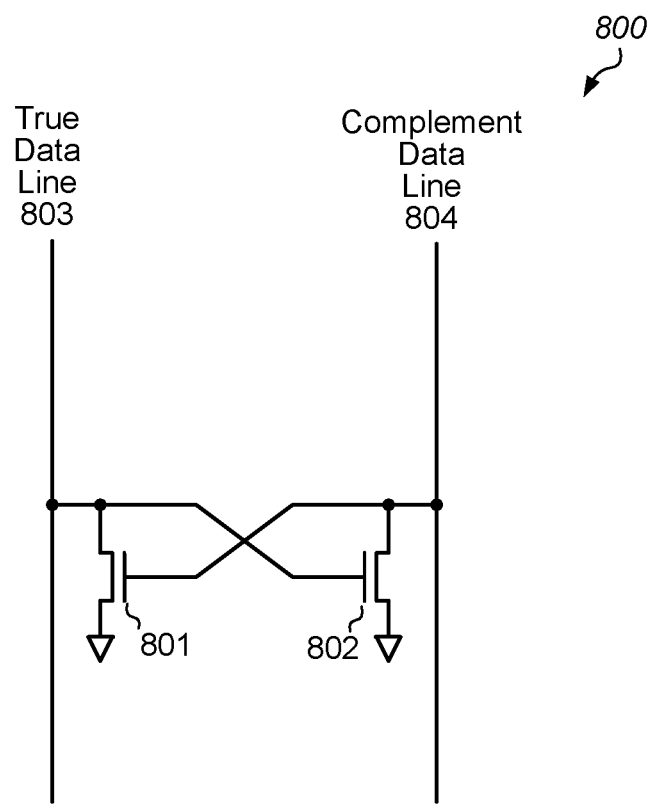
FIG. 8 illustrates an embodiment of a regenerative amplifier circuit.

To increase a difference in the voltage levels of the true and complement data lines, a regenerative amplifier circuit may be employed. An embodiment of such an amplifier circuit is illustrated in FIG. 8. In various embodiments, regenerative amplifier circuit 800 may correspond to regenerative amplifier 111 as depicted in FIG. 1. In the illustrated embodiment, regenerative amplifier circuit 800 includes devices 801 and 802.

Device 801 is coupled between true data line 803 and a ground supply, and device 802 is coupled between complement data line 804 and the ground supply. A control terminal of device 801 is coupled to complement data line 804, and a control terminal of device 802 is coupled to true data line 803. It is noted that, in various embodiments, true data line 803 may correspond to true data line 109a and complement data line 804 may correspond to complement data line 109b.

During operation, the voltage level of complement data line 804 controls an amount of current sunk from true data line 803 by device 801. In a similar fashion, the voltage level of true data line 803 controls an amount of current sunk from complement data line 804 by device 802.

At the start of a read access to a memory circuit, such as, e.g., memory circuit 100 as illustrated in FIG. 1, the voltage levels of true data line 803 and complement data line 804 may be preset to ground potential, thereby deactivate devices 801 and 802. As the read access to the memory circuit progresses, a particular pair of column lines are coupled to true data line 803 and complement data line 804, resulting in one of the voltage level of one of the data lines to be greater than the voltage level of the other.

For example, the voltage level of true data line 803 may be greater than the voltage level of complement data line 804. In response to the voltage levels of the data lines, device 802 will sink more current from complement data line 804 than device 801 will sink from true data line 803. The larger current being sunk from complement data line 804 will result in the voltage level of complement data line 804 to reduce. In some cases, the voltage level of complement data line 804 may reach a voltage level at or near ground potential.

The reduction of the voltage level of complement data line 804, results in a reduction of the current carrying capability of device 801, thereby allowing true data line to remain at its higher voltage level, which may, in some embodiments, be a voltage level at or near a voltage level of a power supply signal. Although the operation of regenerative amplifier 800 has been described for the case when the voltage level of true data line 803 is greater than the voltage level of complement data line 804, when the voltage level of complement data line 804 is greater, regenerative amplifier circuit 800 may operate in a similar fashion, with the roles of devices 801 and 802 reversed.

It is noted that the embodiment illustrated in FIG. 8 is merely an example. In other embodiments, different numbers of devices, different types of devices, and different arrangements of devices are possible and contemplated.

Figure 9:
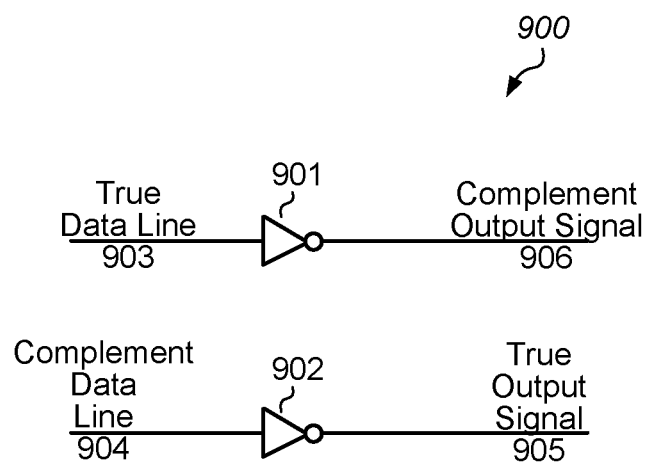
FIG. 9 illustrates an embodiment of a driver circuit.

The performance of regenerative amplifier circuits, such as regenerative amplifier circuit 800, may depend on the capacitive load of the signals being amplified. In some cases, a driver circuit may be employed to isolate larger loads from the signals being amplified. An embodiment of such a driver circuit is illustrated in FIG. 9. In some embodiments, driver circuit 900 may correspond to driver circuit 112 as illustrated in the embodiment of FIG. 1. In the illustrated embodiment, driver circuit 900 includes inverters 901 and 902.

An input of inverter 901 is coupled to true data line 903, and an input of inverter 902 is coupled to complement data line 904. In various embodiments, true data line 903 and complement data line 904 may correspond to true data line 109a and complement data line 109b, respectively, as depicted in FIG. 1.

An output of inverter 901 may be coupled to complement output signal 906, and an output of inverter 902 may be coupled to true output signal 905. In some embodiments, true output signal 905 and complement output signal 906 may correspond to true output signal 113a and complement output signal 113b, respectively, as illustrated in FIG. 1.

During operation, inverter 901 generates a voltage level on complement output signal 906, by inverting the logical sense of the signal present on true data line 903. Additionally, inverter 902 generates a voltage level on true output signal 905 by inverting the logical sense of the signal present on complement data line 904. By generating the output signals in this fashion, the output load of a memory circuit may isolated from the internal data lines of the memory, thereby improving performance of regenerative amplifier coupled to the internal data lines.

CMOS inverters, such as, e.g., inverter 901, depicted herein may be particular embodiments of inverting amplifiers configured to generate an output signal with an opposite logical sense of an input signal. In other embodiments, any suitable type of inverting amplifier may be employed, including inverting amplifiers constructed with technologies other than CMOS.

It is noted that the embodiment depicted in FIG. 9 is merely an example. Moreover, although only two inverters are depicted in the illustrated embodiment, any suitable number of inverters may be employed, in other embodiments.

Figure 10:
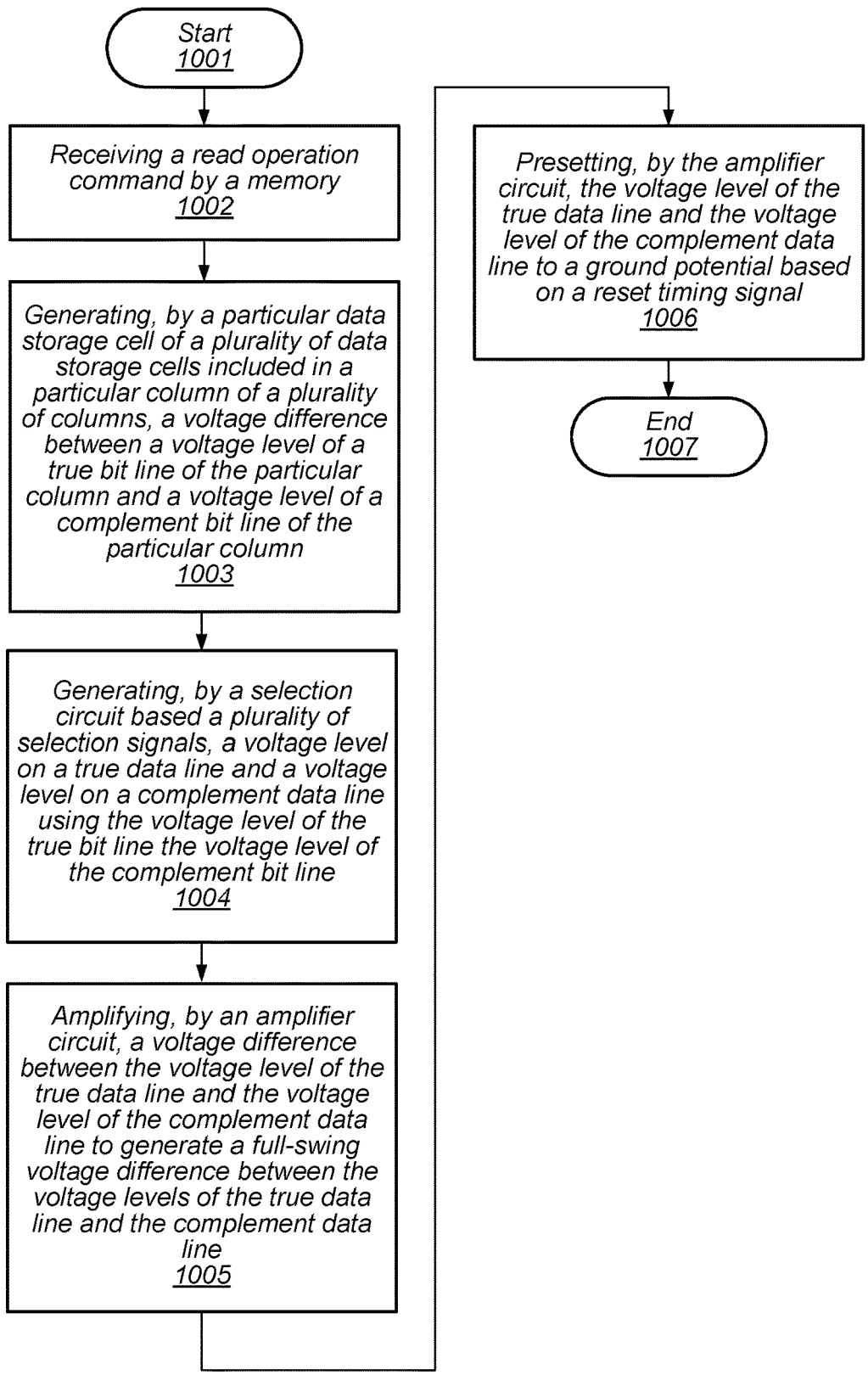
FIG. 10 is a flow diagram depicting an embodiment of operating a memory circuit.

Turning to FIG. 10, a flow diagram depicting an embodiment of operating a memory circuit is illustrated. The method begins in block 1001.

A memory circuit, such as, e.g., memory circuit 100, may receive a read operation command (block 1002). As described below in more detail, the read operation command (or simply "read command") may be received from a processor, a processor core, or other suitable circuit included in a computing system. In some cases, the read operation command may include data indicative of address value. The address value may correspond to a physical location within the memory circuit that is to be accessed as part of the read command.

A particular data storage cell of a plurality of data storage cells included in a particular column of a plurality of columns may generate a voltage difference between a true bit line of the particular column and a complement bit line of the particular column (block 1003). Data stored in the particular data storage cell may be differentially encoded in the voltage difference between the true and complement bit lines. In various embodiments, a preset circuit, such as, e.g., preset circuit 300, may set the voltage levels of the true and complement bit lines to a voltage level at or near a voltage level of a power supply signal before starting the read operation, or upon completing the read operation.

A selection circuit, based on a plurality of selection signals, may then generate a voltage level on a true data line and a voltage on a complement data line using the voltage level of the true bit line of the particular column and the complement bit line of the particular column (block 1004). In some embodiments the selection signals may be generated by decoded the address included with the read command.

As described above, the particular column may include a true column line and a complement column line, and a driver circuit may generate voltage levels on the true column line and the complement column line based on the voltage level of the true bit line and the complement column line.

In some embodiments, to generate the voltage levels on the true and complement data lines, the selection circuit may couple the true column line to the true data line and couple the complement column line to the complement data line based on at least on selection signal.

An amplifier circuit may then amplify a voltage difference between the voltage level of the true data line and the voltage level of the complement data line to generate a full-swing voltage difference between the voltage levels of the true data line and the complement data line (block 1005). In various embodiments, amplifying the voltage difference between the true data line and the complement data line may include sinking a first current from the true data line based on the voltage level of the complement data line, and sinking a second current from the complement data line based on the voltage level of the true data line. In other embodiments, true and complement output signals may be generated by inverting the logical sense of the true and complement data lines.

The amplifier may preset the voltage level of the true data line and the voltage level of the complement data line to ground potential based on a reset timing signal (block 1006). In various embodiments, the reset timing signal may be generated by a timing and control circuit included in or associated with the memory. In some embodiments, the preset operation may be performed in response to receiving the read command. Alternatively, the preset operation may be performed after the read command has been completed in anticipation of receiving another read command. The method may then conclude in block 1007.

It is noted that the embodiment of the method illustrated in the flow diagram of FIG. 10 is merely an example. In other embodiments, different operations and different orders of operations are possible and contemplated.

Figure 11:
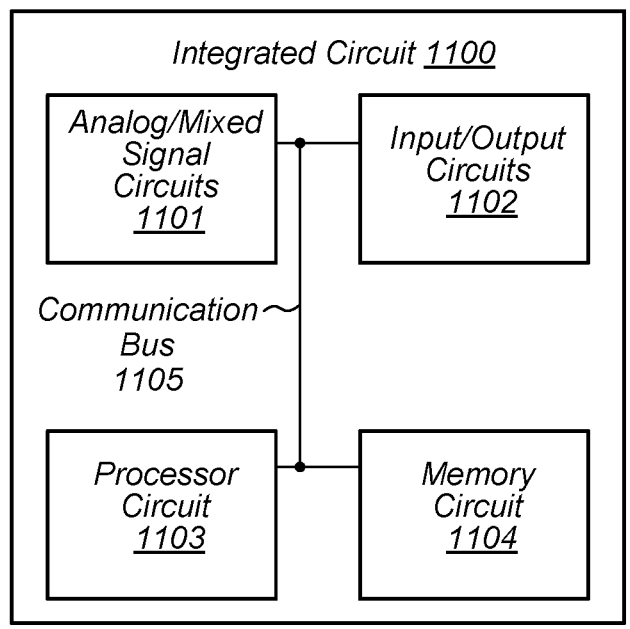
FIG. 11 illustrates an embodiment of a computing system.

A block diagram of integrated circuit is illustrated in FIG. 11. In the illustrated embodiment, the integrated circuit 1100 includes analog/mixed-signal circuits 1101, processor circuit 1103, Input/Output circuits 1102, and memory circuit 1104, each of which may be configured to send requests and data (collectively transactions) the other circuit blocks using communication bus 1105. In various embodiments, integrated circuit 1100 may be configured for use in a desktop computer, server, or in a mobile computing application such as a tablet, or laptop computer, for example.

Processor circuit 1103 may, in various embodiments, be representative of a general-purpose processor that performs computational operations. For example, processor circuit 1103 may be a central processing unit (CPU) such as a microprocessor, a microcontroller, an application-specific integrated circuit (ASIC), or a field-programmable gate array (FPGA).

Memory circuit 1104 may correspond to memory circuit 100 as illustrated in FIG. 1, In various embodiments, memory circuit 1104 may include any suitable type of memory such as a Dynamic Random Access Memory (DRAM), a Static Random Access Memory (SRAM), a Read-only Memory (ROM), Electrically Erasable Programmable Read-only Memory (EEPROM), or a non-volatile memory, for example. It is noted that in the embodiment of an integrated circuit illustrated in FIG. 11, a single memory circuit is depicted. In other embodiments, any suitable number of memory circuits may be employed.

Analog/mixed-signal circuits 1101 may include a variety of circuits including, for example, a crystal oscillator, a phase-locked loop (PLL), an analog-to-digital converter (ADC), and a digital-to-analog converter (DAC) (all not shown). In other embodiments, analog/mixed-signal circuits 1101 may include radio frequency (RF) circuits that may be configured for operation with wireless networks.

Input/output circuits 1102 may be configured to coordinate data transfer between integrated circuit 1100 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, Input/output circuits 1102 may be configured to implement a version of Universal Serial Bus (USB) protocol or IEEE 1394 (Firewire®) protocol.

Input/output circuits 1102 may also be configured to coordinate data transfer between integrated circuit 1100 and one or more devices (e.g., other computing systems or integrated circuits) coupled to integrated circuit 1100 via a network. In one embodiment, input/output circuits 1102 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1102 may be configured to implement multiple discrete network interface ports.

It is noted that the embodiment depicted in FIG. 11 is merely an example. In other embodiments, different circuit blocks and different arrangements of circuit blocks may be used in integrated circuit 1100.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a plurality of memory cells, wherein a particular memory cell of the plurality of memory cells is coupled to a pair of bit lines, and wherein the particular memory cell is configured, upon being activated, to generate a first differential voltage across the pair of bit lines;
   a driver circuit configured to generate a second differential voltage across a pair of column lines using the first differential voltage;
   a selection circuit configured to couple the pair of column lines to a pair of data lines; and
   a regenerative amplifier circuit including a first device coupled between a first data line of the pair of data lines and a ground supply signal, and a second device coupled between a second data line of the pair of data lines and the ground supply signal, wherein the regenerative amplifier circuit is configured to generate a differentially encoded output signal using a third differential voltage across the pair of data lines; and wherein the first device is configured to discharge the first data line using a voltage level of the second data line; and wherein the second device is configured to discharge the second data line using a voltage level of the first data line.

2. The apparatus of claim 1, further comprising, a first preset circuit configured to charge the pair of bit lines to a voltage level of a power supply signal.

3. The apparatus of claim 1, further comprising, a second preset circuit configured to charge the pair of column lines to a voltage level of a power supply signal.

4. The apparatus of claim 1, further comprising, a third preset circuit configured to discharge the pair of data lines to ground.

5. A method, comprising:
generating a first differential voltage across a pair of bit lines coupled to a given memory cell of a plurality of memory cells by activating the given memory cell;
generating a second differential voltage across a pair of column lines using the first differential voltage;
coupling the pair of column lines to a pair of data lines; and
generating a differentially encoded output signal using respective voltage levels of the pair of data lines, by adjusting a first voltage level of a first data line of the pair of data lines using a second voltage level of a second data line of the pair of data lines, and adjusting the second voltage level of the second data line using the first voltage level of the first data line, wherein adjusting the first voltage level includes discharging, using a first device, the first data line using the second voltage level of the second data line.

6. The method of claim 5, further comprising, presetting the pair of bit lines to a voltage level of a power supply signal prior to activating the given memory cell.

7. The method of claim 5, further comprising, presetting the pair of column lines to a voltage level of a power supply signal prior to activating the given memory cell.

8. The method of claim 5, further comprising, discharging presetting the pair of data lines to ground prior to activating the given memory cell.

9. The method of claim 5, wherein adjusting the second voltage level of the second data line includes discharging, using a second device, the second data line using the first voltage level of the first data line.

10. An apparatus, comprising:
a processor circuit configured to generate a read request; and
a memory circuit configured, in response to receiving the read request, to:
activate a given memory cell of a plurality of memory cells to generate a first differential voltage across a pair of bit lines coupled to the given memory cell;
generate a second differential voltage across a pair of column lines using the first differential voltage;
couple the pair of column lines to a pair of data lines; and
generate a differentially-encoded output signal using respective voltage levels of the pair of data lines;
wherein to generate the differentially-encoded output signal, the memory circuit is further configured to:
discharge, using a first device, a first data line of the pair of data lines using a voltage level of a second data line of the pair of data lines to adjust a voltage level of the first data line; and
adjust the voltage level of the second data line using the voltage level of the first data line.

11. The apparatus of claim 10, wherein the memory circuit is further configured to preset the pair of bit lines to a voltage level of a power supply signal prior to an activation of the given memory cell.

12. The apparatus of claim 10, wherein the memory circuit is further configured to preset the pair of column lines to a voltage level of a power supply signal prior to an activation of the given memory cell.

13. The apparatus of claim 10, wherein the memory circuit is further configured to preset the pair of data lines to ground prior to an activation of the given memory cell.

14. The apparatus of claim 10, wherein to adjust the voltage level of the second data line the memory circuit is further configured to discharge, using a second device, the second data line using the voltage level of the first data line.

* * * * *

UNITED STATES PATENT AND TRADEMARK OFFICE
CERTIFICATE OF CORRECTION

PATENT NO. : 10,978,142 B2  
APPLICATION NO. : 16/512133  
DATED : April 13, 2021  
INVENTOR(S) : Su Page 1 of 1

It is certified that error appears in the above-identified patent and that said Letters Patent is hereby corrected as shown below:

On the Title Page

Item (56), Column 2, under Other Publications, Line 4, delete "www.iosrjoumals.org." and insert -- www.iosrjournals.org. --, therefor.

In the Claims

In Column 14, Line 1, in Claim 8, after "comprising," delete "discharging".

Signed and Sealed this  
Third Day of August, 2021

Drew Hirshfeld  
*Performing the Functions and Duties of the*  
*Under Secretary of Commerce for Intellectual Property and*  
*Director of the United States Patent and Trademark Office*